United States Patent
Logunov et al.

(10) Patent No.: US 8,552,642 B2
(45) Date of Patent: Oct. 8, 2013

(54) METHODS AND APPARATUS FOR PACKAGING ELECTRONIC COMPONENTS

(75) Inventors: Stephan Lvovich Logunov, Corning, NY (US); John David Lorey, Corning, NY (US); Vitor Marino Schneider, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 12/884,335

(22) Filed: Sep. 17, 2010

(65) Prior Publication Data

US 2011/0037383 A1 Feb. 17, 2011

Related U.S. Application Data

(62) Division of application No. 11/998,600, filed on Nov. 30, 2007, now Pat. No. 7,815,480.

(51) Int. Cl.
 *H01J 1/62* (2006.01)
 *H01J 63/04* (2006.01)

(52) U.S. Cl.
 USPC ........................................ 313/512; 313/504

(58) Field of Classification Search
 USPC ........... 313/504, 512; 438/126, 106; 445/25; 349/190
 See application file for complete search history.

(56) References Cited

U.S. PATENT DOCUMENTS

| | | | |
|---|---|---|---|
| 4,940,200 A * | 7/1990 | Sawyer et al. | 248/97 |
| 6,416,375 B1 * | 7/2002 | Cho et al. | 445/25 |
| 6,603,254 B1 * | 8/2003 | Ando | 313/495 |
| 6,791,660 B1 * | 9/2004 | Hayashi et al. | 349/190 |
| 6,998,776 B2 | 2/2006 | Aitken et al. | 313/512 |
| 7,362,404 B2 * | 4/2008 | Tadaki et al. | 349/156 |
| 7,537,504 B2 * | 5/2009 | Becken et al. | 445/25 |
| 2003/0201448 A1 * | 10/2003 | Yamazaki et al. | 257/79 |
| 2004/0207314 A1 | 10/2004 | Aitken et al. | 313/504 |
| 2005/0001545 A1 | 1/2005 | Aitken et al. | 313/512 |
| 2005/0218802 A1 * | 10/2005 | Sz | 313/512 |
| 2006/0012300 A1 * | 1/2006 | Lan et al. | 313/512 |
| 2006/0082298 A1 | 4/2006 | Becken et al. | 313/512 |
| 2007/0096631 A1 | 5/2007 | Sung et al. | 313/498 |
| 2007/0128965 A1 | 6/2007 | Burt et al. | 445/25 |
| 2007/0128966 A1 | 6/2007 | Becken et al. | 445/25 |
| 2007/0128967 A1 | 6/2007 | Becken et al. | 445/25 |
| 2007/0170423 A1 | 7/2007 | Choi et al. | 257/40 |
| 2007/0170605 A1 | 7/2007 | Lee et al. | 264/1.1 |
| 2007/0170839 A1 | 7/2007 | Choi et al. | 313/500 |
| 2007/0170845 A1 * | 7/2007 | Choi et al. | 313/504 |
| 2007/0173167 A1 * | 7/2007 | Choi | 445/25 |
| 2007/0247068 A1 | 10/2007 | Park | 313/512 |
| 2008/0050846 A1 * | 2/2008 | Kim | 438/5 |
| 2008/0206925 A1 * | 8/2008 | Chatterjee et al. | 438/106 |

* cited by examiner

*Primary Examiner* — Mariceli Santiago
*Assistant Examiner* — Glenn Zimmerman
(74) *Attorney, Agent, or Firm* — Kevin M. Able

(57) ABSTRACT

Packages for elements, e.g., OLEDs, that are temperature sensitive are provided. The packages have a first glass substrate (12), a second glass substrate (16), and a wall (14) that separates the first and second substrates (12,16) and hermetically seals at least one temperature sensitive element (18,28, 36) between the substrates (12,16). The wall (14) comprises a sintered frit and at least a portion of the wall is laser sealed to the second substrate (16) by melting a glass component of the sintered frit. The minimum width (40) of the laser-sealed portion of the wall (14) at any location along the wall (14) is greater than or equal to 2 millimeters so as to provide greater hermeticity and strength to the package. The laser sealing is performed without substantially degrading the temperature sensitive element(s) (18,28,36) housed in the package.

15 Claims, 7 Drawing Sheets

US 8,552,642 B2

METHODS AND APPARATUS FOR PACKAGING ELECTRONIC COMPONENTS

CROSS-REFERENCE TO RELATED APPLICATIONS

This application is a divisional of and claims the benefit of priority to U.S. patent application Ser. No. 11/998,600, filed on Nov. 30, 2007 now U.S. Pat. No. 7,815,480, the content of which is relied upon and incorporated herein by reference in its entirety.

I. FIELD OF THE INVENTION

This invention relates to methods and apparatus for packaging electronic components, such as the organic light emitting diodes (OLEDs) used in display devices.

II. BACKGROUND OF THE INVENTION

OLED-based displays are currently being considered for use in many applications which presently employ liquid crystal displays (LCDs). OLED-based displays can provide brighter and clearer images than liquid crystal displays and also need less power. However, OLEDs are susceptible to damage resulting from exposure to oxygen and moisture. Such exposure may lead to a reduction in the useful life of the light emitting device. Therefore, hermetic sealing is one of basic requirements for long term performance of OLEDs.

Efforts have been made to hermetically seal OLED-based displays with organic materials, such as epoxy resins. An alternate technology with substantially better performance has been developed by Corning Incorporated, the assignee of this application. In accordance with this approach, a frit-containing paste is made by mixing glass particles, filler particles, e.g., crystalline particles, and a vehicle, e.g., a vehicle comprising one or more solvents and one or more binders and/or dispersing aids. The paste is dispensed on a first substrate (e.g., a first glass sheet) and is sintered using, for example, a high temperature furnace to produce a sintered frit pattern.

The resulting assembly, known as a frit cover glass or simply a cover, is combined with a second substrate (e.g., a second glass sheet) carrying one or more OLED devices. The cover and the second substrate are sealed together by exposing the sintered frit pattern to laser energy. In particular, a laser beam is scanned (traversed) over the sintered frit pattern to locally raise the temperature of the sintered frit above its softening point. In this way, the sintered frit adheres to the second substrate and forms a strong seal between the cover and the second substrate. Since the sintered frit is a glass and ceramic material, as opposed to an organic material, the penetration of oxygen and moisture through the frit seal is much slower than through the epoxy seals previously used to encapsulate OLED devices.

The sealing of larger size OLED devices, such as full-size TVs having a diagonal of, for example, 14 inches or larger, is more challenging than sealing smaller OLED devices, such as those used in cell phones, PDAs and other mobile electronic devices. For a typical small OLED device, a sintered frit with a sealing width of around 0.7-1.0 mm has proved sufficient. In particular, these sealing widths have been found to provide a sufficient moisture and oxygen barrier to allow a typical display to operate successfully for 1-3 years. In addition, such sealing widths provide sufficient mechanical strength for these smaller devices. The small sealing widths are also compatible with the limited space available on small OLED devices for sealing. For example, for a typical small OLED device, the edge area that can be dedicated to sealing has a width of only 1.0-1.5 millimeters.

In comparison to small devices, larger size OLED devices such as TVs require longer service times and have more demanding mechanical requirements. As a consequence, a need has arisen for large size packages for sensitive electronic components, such as OLEDs, which have seals that are stronger and/or provide greater protection from influx of water and oxygen. The present invention addresses this need.

III. SUMMARY OF THE INVENTION

In accordance with a first aspect, the invention provides a packaging method comprising:

(A) providing a first substrate (12), a second substrate (16), a wall (14) that separates the first and second substrates (12, 16), and at least one temperature sensitive element (18,28,36) that is disposed between the first and second substrates (12, 16), said wall (14) comprising a sintered glass frit having a melting temperature $T_{frit-melt}$ and said at least one temperature sensitive element (18,28,36) having a degradation temperature $T_{degrade}$, said wall (14) being bonded to said first substrate (12) and in contact with said second substrate (16); (B) impinging a laser beam having a diameter $D_{beam}$ on the wall (14); and (C) traversing the beam along a length of the wall (14) at a speed S to heat the wall (14) and seal at least a portion of the width (42) of the wall (14) to the second substrate (16);

wherein:

(i) the minimum distance (44) between an edge of the at least one temperature sensitive element (18,28,36) and an edge of the portion of the wall (14) sealed to the second substrate (16) at any location along the wall is $L_{min}$;

(ii) the minimum width (40) of the portion of the wall (14) sealed to the second substrate (16) at any location along the wall is $W_{seal-min}$; and (iii) $D_{beam}$, $L_{min}$, $W_{seal-min}$, $T_{frit-melt}$, $T_{degrade}$, and S satisfy the relationships:

(a) $W_{seal-min} \geq 2$ mm,
(b) $D_{beam} > W_{seal-min}$,
(c) $S \geq (11 \text{ mm/sec}) \cdot (D_{beam}/2 \text{ mm}) \cdot (0.2 \text{ mm}/L_{min}) \cdot (65^\circ C./T_{degrade})^2$, and
(d) $S \leq (130 \text{ mm/sec}) \cdot (D_{beam}/2 \text{ mm}) \cdot (450^\circ C./T_{frit-melt})^2$.

In accordance with a second aspect, the invention provides a package comprising a first glass substrate (12), a second glass substrate (16), a wall (14) that separates the first and second substrates (12,16), and at least one element (18,28,36) that is sensitive to oxygen and/or moisture and is hermetically sealed between the first and second substrates (12,16) by the wall (14), said wall (14) comprising a sintered glass frit having a melting temperature $T_{frit-melt}$ and said at least one element (18,28,36) having a degradation temperature $T_{degrade}$, wherein:

(i) at least a portion of the width (42) of the wall (14) is laser sealed to the second substrate (16);

(ii) the minimum width (40) of the portion of the wall (14) sealed to the second substrate (16) at any location along the wall is $W_{seal-min}$;

(iii) the minimum distance (44) between an edge of the at least one element (18,28,36) and an edge of the portion of the wall (14) sealed to the second substrate (16) at any location along the wall is $L_{min}$; and (iv) $W_{seal-min}$, $L_{min}$, and $T_{frit-melt}$ satisfy the relationships:

(a) $W_{seal-min} \geq 2$ mm;
(b) $0.2 \text{ mm} \leq L_{min} \leq 2.0$ mm; and
(C) $T_{frit-melt} \geq 6.0 \cdot T_{degrade}$.

In certain embodiments of the first and second aspects of the invention, $W_{seal-min}$ is less than or equal to 7 millimeters. Preferably, $W_{seal-min}$ is less than or equal to 6 millimeters and greater than or equal to 3 millimeters, e.g., $W_{seal-min}$ approximately equals 5 millimeters.

In accordance with a third aspect, the invention provides a package comprising a first glass substrate (12), a second glass substrate (16), a wall (14) that comprises a sintered glass frit and separates the first and second substrates (12,16), and at least one element (18,28,36) that is sensitive to oxygen and/or moisture and is hermetically sealed between the first and second substrates (12,16) by the wall (14), wherein the wall (14) comprises a plurality of isolated compartments (32), each compartment (32) comprising a plurality of sub-walls (30) which are arranged so that oxygen and/or moisture can readily pass through the compartment only if at least two of the sub-walls (30) are breached.

In accordance with a fourth aspect, the invention provides a package comprising a first glass substrate (12), a second glass substrate (16), a wall (14) that separates the first and second substrates (12,16), and at least one element (18,28,36) that is sensitive to oxygen and/or moisture and is hermetically sealed between the first and second substrates (12,16) by the wall (14), wherein the wall (14) comprises a plurality of sub-walls (30) that comprise a sintered glass frit and a sub-wall (34) that (i) comprises an organic material, e.g., an epoxy resin, and (ii) is located between two of the sub-walls that comprise a sintered frit. In certain embodiments, the sub-wall that comprises an organic material does not contact the sub-walls that comprise a sintered glass frit.

The reference numbers used in the above summaries of the various aspects of the invention are only for the convenience of the reader and are not intended to and should not be interpreted as limiting the scope of the invention. More generally, it is to be understood that both the foregoing general description and the following detailed description are merely exemplary of the invention and are intended to provide an overview or framework for understanding the nature and character of the invention.

Additional features and advantages of the invention are set forth in the detailed description which follows, and in part will be readily apparent to those skilled in the art from that description or recognized by practicing the invention as described herein. The accompanying drawings are included to provide a further understanding of the invention, and are incorporated in and constitute a part of this specification. It is to be understood that the various features of the invention disclosed in this specification and in the drawings can be used in any and all combinations.

IV. BRIEF DESCRIPTION OF THE DRAWINGS

V. DETAILED DESCRIPTION OF THE INVENTION AND ITS PREFERRED EMBODIMENTS

As discussed above, in accordance with certain of its aspects, the present invention relates to packaging of temperature sensitive elements, e.g., OLEDs, by laser sealing wherein the resulting seal has a wider width (i.e., a larger $W_{seal-min}$) so as to provide the package with greater strength and a longer useful life.

Figure 1:
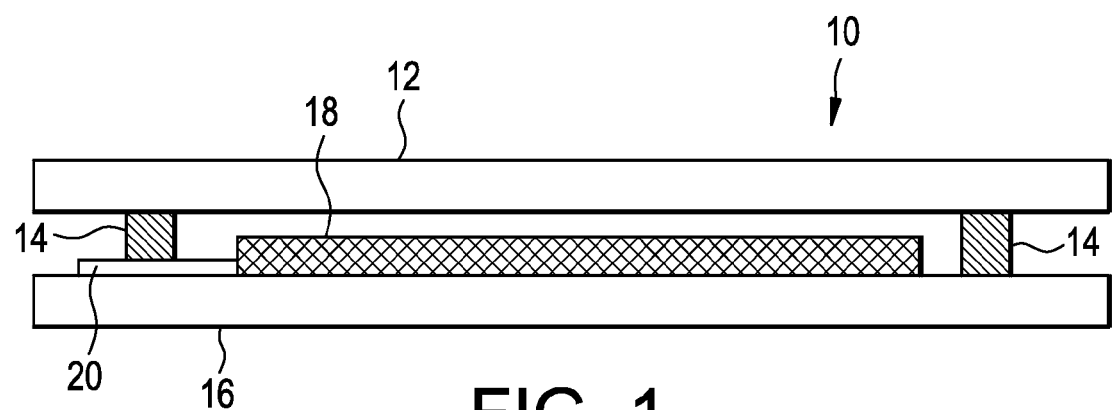
FIG. 1 is a schematic, cross sectional, side view of a display device according to an embodiment of the present invention.
Figure 2:
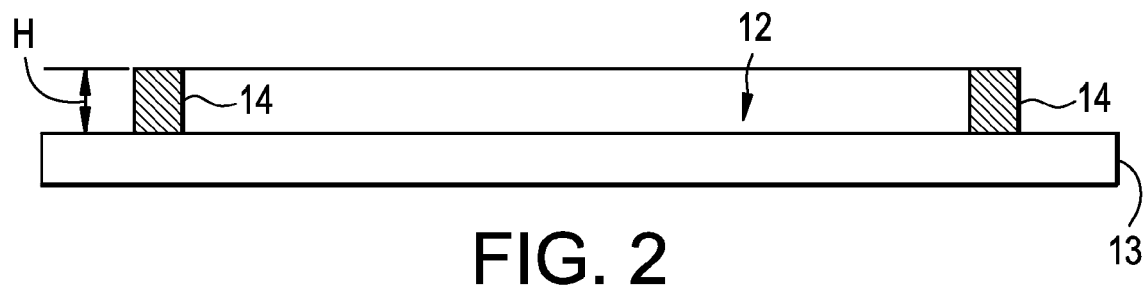
FIG. 2 is a cross sectional side view of a glass sheet with a sintered frit pattern bonded thereto in accordance with an embodiment of the present invention.
Figure 3:
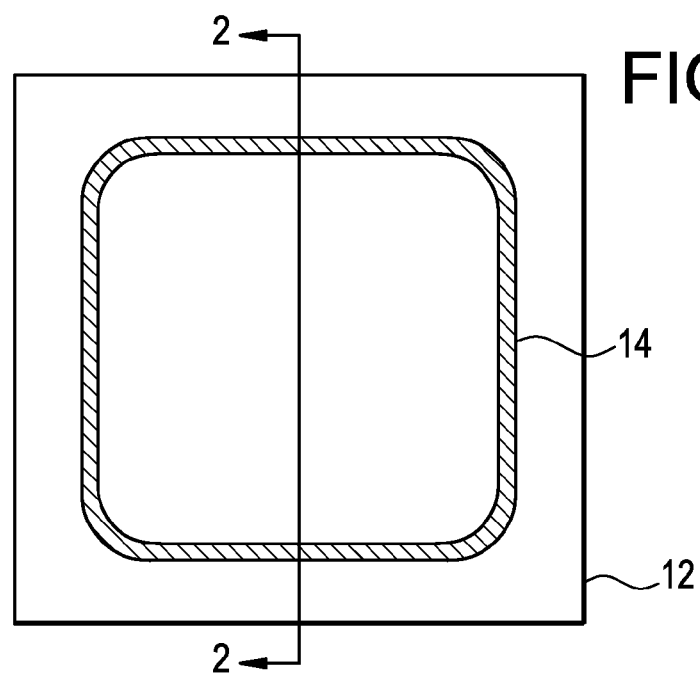
FIG. 3 is a top view of the glass sheet of FIG. 2 showing the sintered frit pattern as having the shape of a frame.

FIG. 1 is a schematic, cross-sectional, side view of a hermetically sealed OLED display device, generally designated by reference numeral 10, comprising a first substrate 12, a sintered frit pattern 14, a second substrate 16, at least one OLED element 18, and at least one electrode 20 in electrical contact with the OLED element. Typically, OLED element 18 is in electrical contact with an anode electrode and a cathode electrode. Electrode 20 in FIG. 1 is intended to represent either electrode. Although only a single OLED element is shown for simplicity, display device 10 may have many OLED elements disposed therein. The typical OLED element 18 includes one or more organic layers (not shown) and anode/cathode electrodes. However, it should be readily appreciated by those skilled in the art that any known OLED element 18 or future OLED element 18 can be used in display device 10. In addition, it should be appreciated that another type of thin film device can be housed in the packages of the invention besides OLED element 18. For example, thin film sensors, photovoltaic cells, and the like may be fabricated using the present invention.

In one embodiment, first substrate 12 is a transparent, thin glass sheet produced using the fusion process, e.g., Corning Incorporated's Code 1737, EAGLE$^{2000}$® or EAGLE XG™ glasses, or the fusion glasses produced by Nippon Electric Glass Co., NHTechno, and Samsung Corning Precision Glass Co. Alternatively, first substrate 12 can be produced by other processes, e.g., the float process used by Asahi Glass Co. to produce OA10 glass and OA21 glass. Second substrate 16 may be made of the same glass as first substrate 12 or it may be a non-transparent substrate.

Prior to sealing first substrate 12 to second substrate 16, a frit-containing paste is deposited on a major surface of first substrate 12 in a predetermined pattern, which is typically placed approximately 1 mm away from the free edges 13 of first substrate 12 as a line, or a plurality of connected lines, and is typically deposited in the shape of a closed frame or wall. As used herein, the word "wall" is used in the sense of a barrier between the inside of the package and the outside atmosphere. As such, it can have a variety of shapes, e.g., circular, square, rectangular, triangular, etc. As will be discussed below, in certain embodiments of the invention, the wall can be composed of sub-walls (see FIGS. 8-10).

Preferably, after being deposited on first substrate 12, the frit-containing paste is sintered prior to being sealed to second substrate 16. To accomplish this, the deposited paste can, for example, be heated so that it becomes attached to first substrate 12, and then the substrate/heated paste combination can be placed in a furnace which sinters the paste (also referred to in the art as "firing" or "consolidating" the paste) to form the desired assembly of sintered frit pattern 14 bonded to first substrate 12. Alternatively, the initial heating step can be omitted, with the substrate/paste pattern combination being directly placed into a furnace for sintering. As a still further alternative, the sintering can be performed by heating just the paste pattern and the surrounding substrate, rather than the entire glass sheet. This localized heating can be performed on the entire paste pattern simultaneously or on sequential portions. In general, the furnace approach with an initial heating step is preferred since during the initial heating, organic components of the vehicle, e.g., organic binder materials, are burned out. The sintering temperature and time will, of course, depend on the composition of the paste, specifically, the composition of the paste's glass particles.

After sintered frit pattern 14 is formed, it can be ground, if necessary and desired, so that the height variation along the frit line does not exceed about 2-4 microns, with a typical target height H being 10 microns to greater than 20 microns, depending on the application for device 10; however, more typically height H is about 14-16 microns. If the height variation is larger, a gap, which may be formed between the sintered frit pattern and second substrate 16 when glass sheet 12 and substrate 16 are joined, may not close when the sintered frit pattern 14 melts during laser sealing (see below), or the gap may introduce stresses which can crack one or both of the substrates, particularly during cooling. An adequate but not overly thick frit height H allows the laser sealing to be performed from the backside of first substrate 12. If sintered frit pattern 14 is too thin, it does not leave enough material to absorb the laser radiation, resulting in failure. If the pattern is too thick, it will be able to absorb enough energy at the surface of the first substrate to melt, but will prevent the necessary energy needed to melt the sintered frit from reaching the region of the frit proximate substrate 16. This usually results in poor or spotty bonding of the first and second substrates.

If the sintered frit pattern 14 is ground, the assembly of first substrate 12 and its attached sintered frit pattern 14 may go through a mild ultrasonic cleaning environment to remove any debris that may have accumulated. During cleaning, the temperature can be kept low to avoid degradation of the sintered frit pattern 14. After cleaning (if performed), a final processing step can be performed to remove residual moisture. For example, the assembly can be placed in a vacuum oven at a temperature of 100° C. for 6 or more hours. After removal from the oven, the assembly can be placed in a clean room box to deter accumulation of dust and debris.

The sealing process includes placing the assembly of first substrate 12 and sintered frit pattern 14 on top of substrate 16, with one or more OLEDs 18 and one or more electrodes 20 deposited on the substrate 16, in such a manner that the sintered frit pattern, the one or more OLEDs, and the electrodes are sandwiched between the first and second substrates 12 and 16 separated by the thickness of the frit pattern. Mild pressure can be applied to the first and second substrates 16 to keep them in contact during the sealing process.

A laser beam is then directed onto frit pattern 14 through first substrate 12. Alternatively, if substrate 16 is transparent at the sealing wavelength, sealing may be performed through substrate 16, or through both substrates. In each case, the beam or beams are traversed over the sintered frit pattern to locally heat the pattern such that the glass component of the sintered frit melts and forms a hermetic seal which connects and bonds substrate 12 to substrate 16. The gap between substrates 12 and 16 resulting from the presence of the sintered frit seal 14 forms a hermetic envelope or package for OLED element 18. In particular, the package comprises the two substrates which form the faces of the package and the sintered frit 14 which forms the wall of the package. The hermetic seal of the package protects OLED(s) 18 by preventing oxygen and moisture in the ambient environment from entering into OLED display 10.

The laser beam or beams used during bonding can be defocused, for example, to make the temperature gradient within the sintered frit pattern more gradual. It should be noted that if the gradient is too steep (focus is too tight), OLED display 10 may exhibit cracking and subsequent failure. The sintered frit pattern generally needs a warm up and cool down phase during melting. In addition, prior to use, the assembly of the first substrate 12 and sintered frit pattern 14 is preferably stored in an inert atmosphere to prevent re-adsorption of $O_2$ and $H_2O$ before melting.

Further details regarding the formation of hermetically-sealed packages by traversing a laser beam over a sintered frit pattern can be found in commonly-assigned U.S. Patent Application Publications Nos. 2006/0082298, 2007/0128965, 2007/0128966, and 2007/0128967, the contents of which in their entireties are incorporated herein by reference.

Similarly, suitable compositions for the sintered glass frit which forms the wall of the package can be found in commonly-assigned U.S. Patent Application Publication No. 2005/0001545, entitled "Glass Package that is Hermetically Sealed with a Frit and Method of Fabrication," which is a continuation-in-part of U.S. Pat. No. 6,998,776, the contents of both of which in their entirety are incorporated herein by reference. A presently preferred glass for the glass component of the sintered frit comprises: 22.92 mole % $Sb_2O_3$, 46.10 mole % $V_2O_5$, 0.97 mole % $TiO_2$, 0.97 mole % $Al_2O_3$, 2.61 mole % $Fe_2O_3$, and 26.43 mole % $P_2O_5$; a presently preferred ceramic for the filler particles of the sintered frit comprises: 50 mole % $SiO_2$, 25 mole % $Al_2O_3$, and 25 mole % $Li_2O$. Other sintered glass frits, now known or subsequently developed, can, of course, be used in the practice of the invention.

As discussed above, large size displays, i.e., displays having a diagonal of at least 14 inches, present challenges to the existing processes for sealing OLEDs. Larger displays have longer seal lengths which means that there are more chances for water and oxygen to penetrate through the barrier provided by the seal. Importantly, OLED display degradation does not happen uniformly over all of the display area, but primarily next to leak locations. Therefore, the degradation rate of an OLED display is about the same as the area next to leak locations, which is the seal perimeter. Larger OLED devices have larger seal perimeters. In particular, for typical display aspect ratios, the ratio of the display area to its perimeter is proportional to the display size.

One way to decrease water and oxygen permeability rates is to increase the width of the seal. In general terms, the permeability rate scales exponentially with seal width for a seal composed of a sintered glass frit. Thus, given that the lifetime of a small OLED, e.g., an OLED for use in a cell phone, is on the order of 1-2 years with a 0.7-1.0 mm seal width, then the lifetime of a device having a sintered frit whose minimum seal width is 5 mm will be on the order of about 50 years. Moreover, the wider sealing width will also improve the overall mechanical strength of the device.

Figure 8:
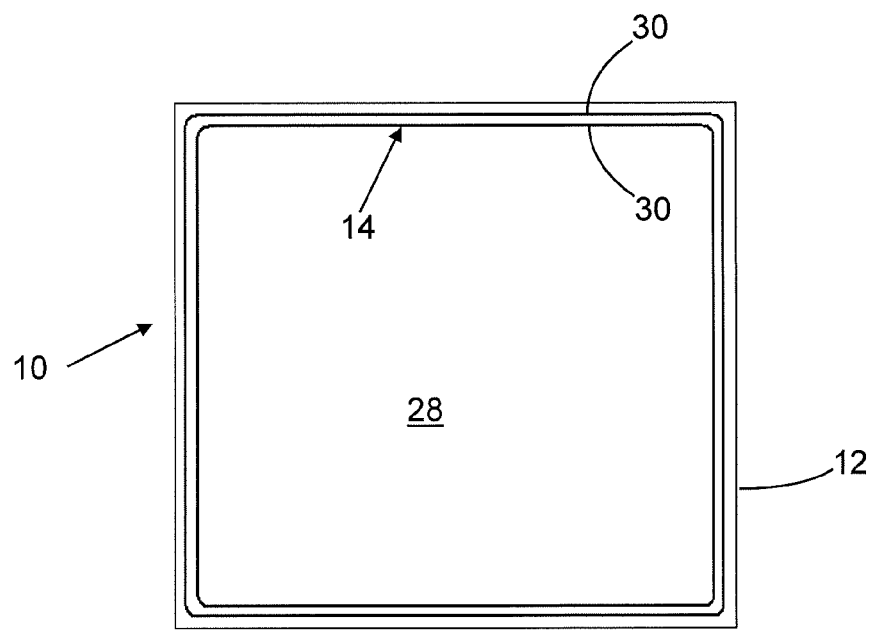
FIG. 8 is a schematic diagram of an embodiment of the invention employing a sintered frit wall composed of nested sub-walls.
Figure 9:
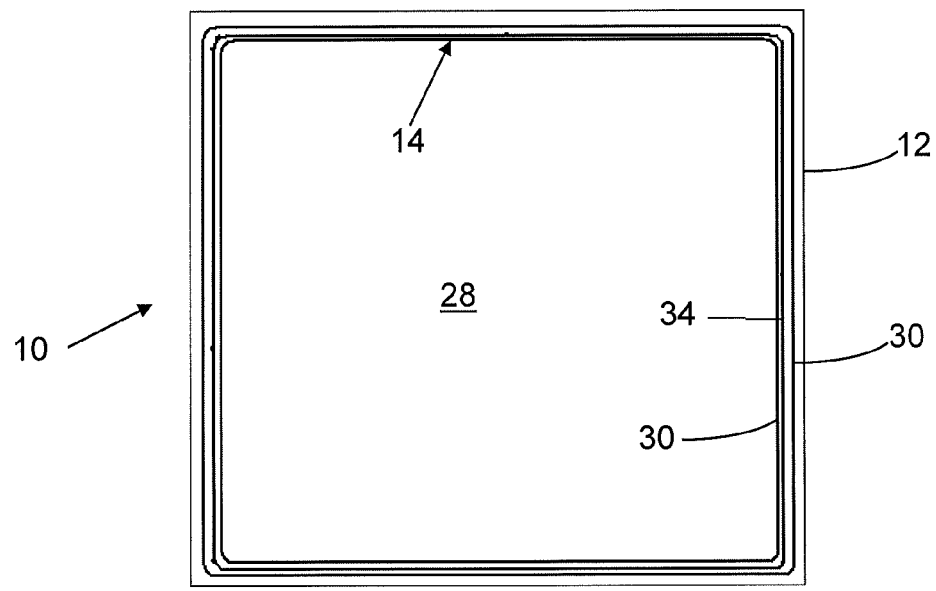
FIG. 9 is a schematic diagram of an embodiment of the invention employing a wall comprising nested sub-walls composed of a sintered frit and a sub-wall composed of an organic material.
Figure 10:
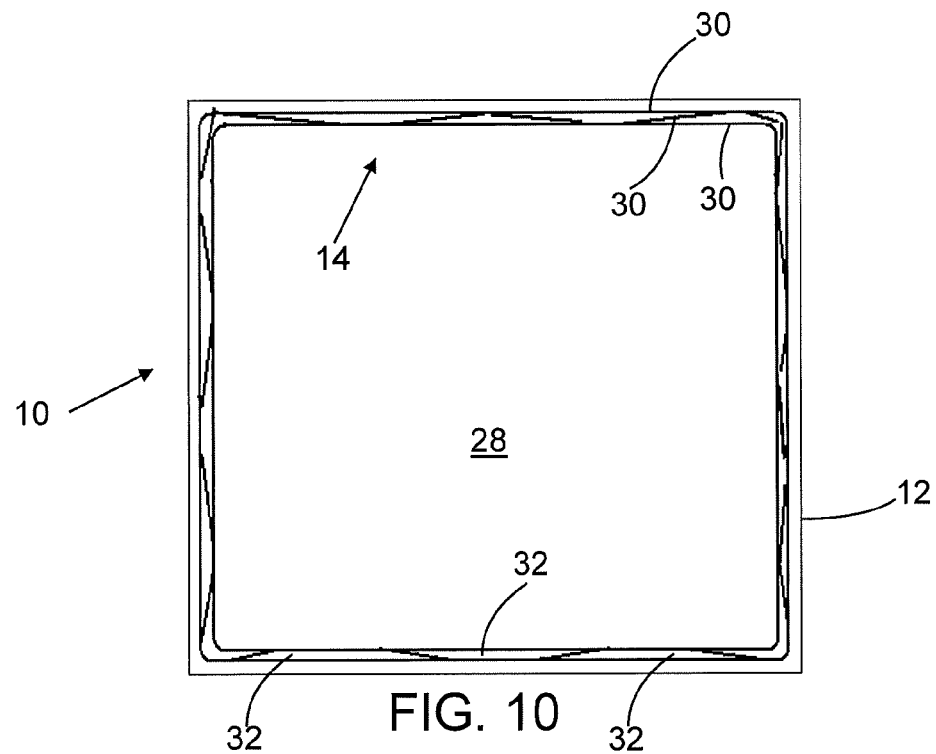
FIG. 10 is a schematic diagram of an embodiment of the invention employing a wall having isolated compartments which can mitigate leaking due to a local defect.

One approach for increasing the effective width of a sintered frit seal is to use a wall composed of multiple sub-walls nested within one another (see, for example, FIGS. 8-10, where reference number 14 represents the wall and reference number 30 represents sintered glass frit sub-walls). The sub-walls can, for example, have a width in the previously used 0.7-1.0 mm range. The presence of these multiple sub-walls increases both the hermeticity of the package and its strength.

Unfortunately, in connection with the present invention, it was discovered that multiple sintered-frit sub-walls in and of themselves present significant sealing challenges. Specifically, it was found that although one of the sub-walls could be laser sealed using the techniques employed with small OLED packages, when laser sealing was performed on another sub-wall, the heat generated by the laser damaged the seal of the first sub-wall. In particular, sealing of the second sub-wall was found to delaminate the neighboring first sub-wall, probably as the result of thermal expansion. Thus, in terms of laser sealing, it was discovered that a nested set of sintered-frit sub-walls need to be treated as one thick wall with all of the sub-walls being sealed together at one time.

Figure 4:
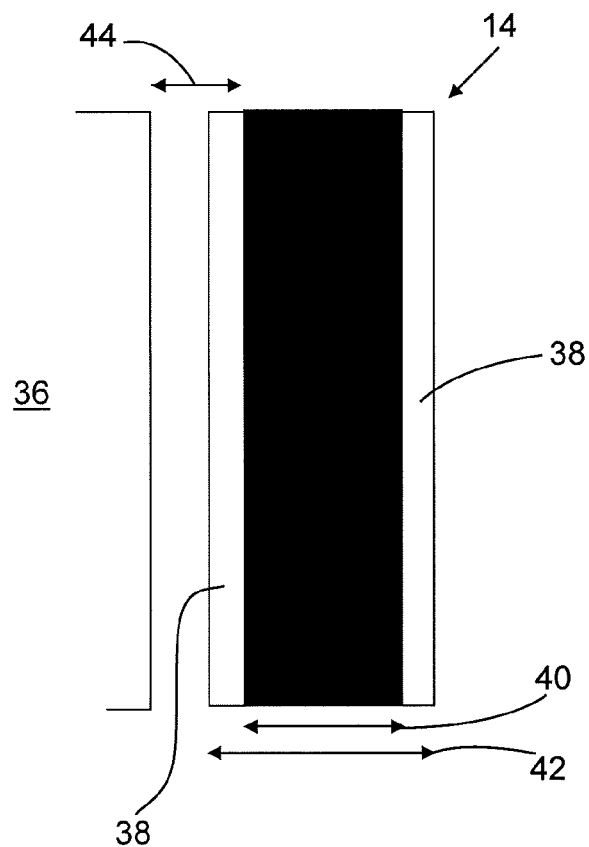
FIG. 4 is a schematic diagram showing various geometric relationships relevant to the present invention.

FIG. 4 is a schematic diagram showing various geometric relationships relevant to the present invention. In this figure, reference number 36 represents a temperature sensitive element, e.g., an OLED, and reference number 14 represents the wall of the assembled package for the temperature sensitive element. Wall 14 can be 1) a single sintered glass frit (see, for example, FIGS. 1 and 7), 2) a plurality of sintered-frit sub-walls (see, for example, FIGS. 8 and 10 where the sintered-frit sub-walls are identified by the reference number 30), or 3) a combination of sintered-frit sub-walls and one or more additional sub-walls composed of an organic material, e.g., an epoxy resin (see, for example, FIG. 9 where the sintered-frit sub-walls are identified by the reference number 30 and the sub-wall composed of an organic material is identified by the reference number 34).

In FIG. 4, the overall width of wall 14 is illustrated by line 42 and the sealed width is illustrated by line 40, where the sealed width is the portion of the wall which becomes laser sealed to the second substrate. As shown in FIG. 4, wall 14 does not include sub-walls. If sub-walls are used, the overall width is simply the distance between the innermost edge of the innermost sub-wall and the outermost edge of the outermost sub-wall and the sealed width is the distance between the innermost and outermost locations where the wall becomes laser sealed to the second substrate.

Sealed width 40 can be equal to overall width 42 or, as shown in FIG. 4, smaller than the overall width so as to leave unsealed portions 38. Also, the sealed width can be uniform, as shown in FIG. 4, or can vary along the length of the wall. In either case, the sealed width is characterized by a minimum value, i.e., $W_{seal\text{-}min}$. For the uniform sealed width case illustrated in FIG. 4, $W_{seal\text{-}min}$ is equal to the length of line 40; for the general case, $W_{seal\text{-}min}$ is the smallest transverse width of the sealed portion of the wall at any place along the length of the wall.

FIG. 4 also shows the spatial relationship between the temperature sensitive component 36 and the wall 14. In particular, reference number 44 shows the minimum distance $L_{min}$ between an edge of the temperature sensitive element and an edge of the portion of the wall sealed to the second substrate. As shown in FIG. 4, the spacing between the temperature sensitive element and the sealed portion of the wall is constant, it being understood that this spacing may be different at different locations along the wall depending on the configuration of the wall and the layout of the temperature sensitive element or elements within the package defined by the wall. For cases in which the spacing varies, $L_{min}$ is smallest spacing anywhere along the length of the wall.

In connection with the laser sealing of sintered glass frits having widths in the 0.7-1.0 mm range, certain combinations of laser power and sealing speed have been found acceptable. For example, a laser beam with a Gaussian intensity distribution has been found suitable, provided the beam diameter is 1.8 times the width of the sintered glass frit. For the 0.7-1.0 mm sintered-frits, this relationship provides a uniform temperature distribution across the sintered frit and effective heating/cooling rates along the sintered frit. (It should be noted that as used herein, beam diameter ($D_{beam}$) is determined using the $1/e^2$ definition of beam size of the ISO 11146 standard. That is, the boundaries of the laser beam are defined as the locations at which beam intensity has fallen to $1/e^2$ of its peak value.)

With larger beam diameters and larger sintered-frit widths, the amount of time each individual location in the longitudinal direction is heated changes significantly. In particular, to have the same linear heating rate, a larger laser spot size requires a higher scanning speed. Looked at another way, sealing at the same scanning speed for a 1.8 mm beam size and a 9 mm beam size would mean effectively decreasing the linear heating rate by 5 times. These considerations suggest that a sealed frit width of 5 mm would require a laser spot size of 9 mm with significantly higher power and sealing speed ~5 times faster than that for 1 mm frit with 1.8 mm spot size.

More generally, a change in the width of the sealed wall changes power requirements for the laser, scanning speed, and most importantly thermal management, since the amount of heat supplied to the package in comparison to a thinner wall becomes much larger. In addition, changes in beam shape also become relevant in reducing the adverse effects of the sealing process on the temperature sensitive element(s) being packaged.

In general, speed and power are linked since the temperature required to melt the sintered-frit and thus form a seal with the second substrate is the same regardless of power and speed. However, at lower speeds more heat diffusion occurs, leading to a wider heated area in the glass and thus a greater possibility of damage to the temperature sensitive element(s) which are being packaged.

Figure 5A:
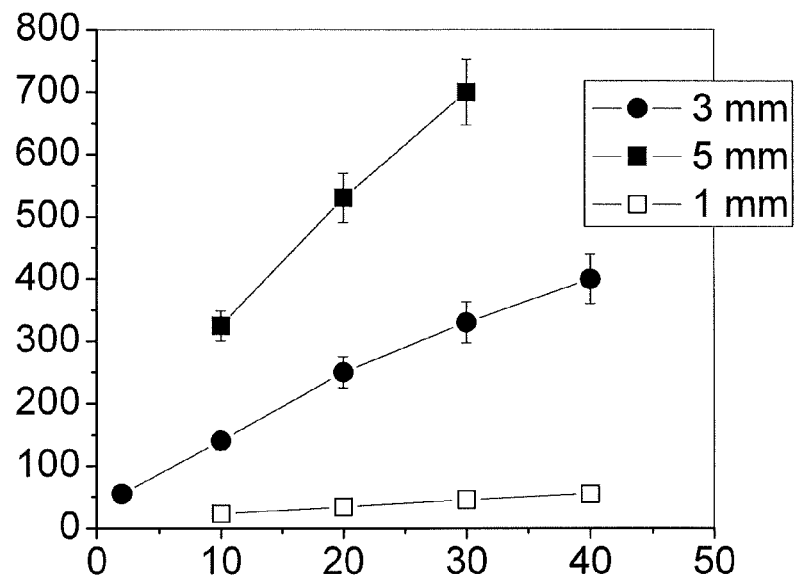
FIG. 5A is a plot showing the relationship between laser power and laser scanning speed for three different sintered frit widths. The vertical axis in this figure is laser power in watts and the horizontal axis is scanning velocity in millimeters/second.
Figure 5B:
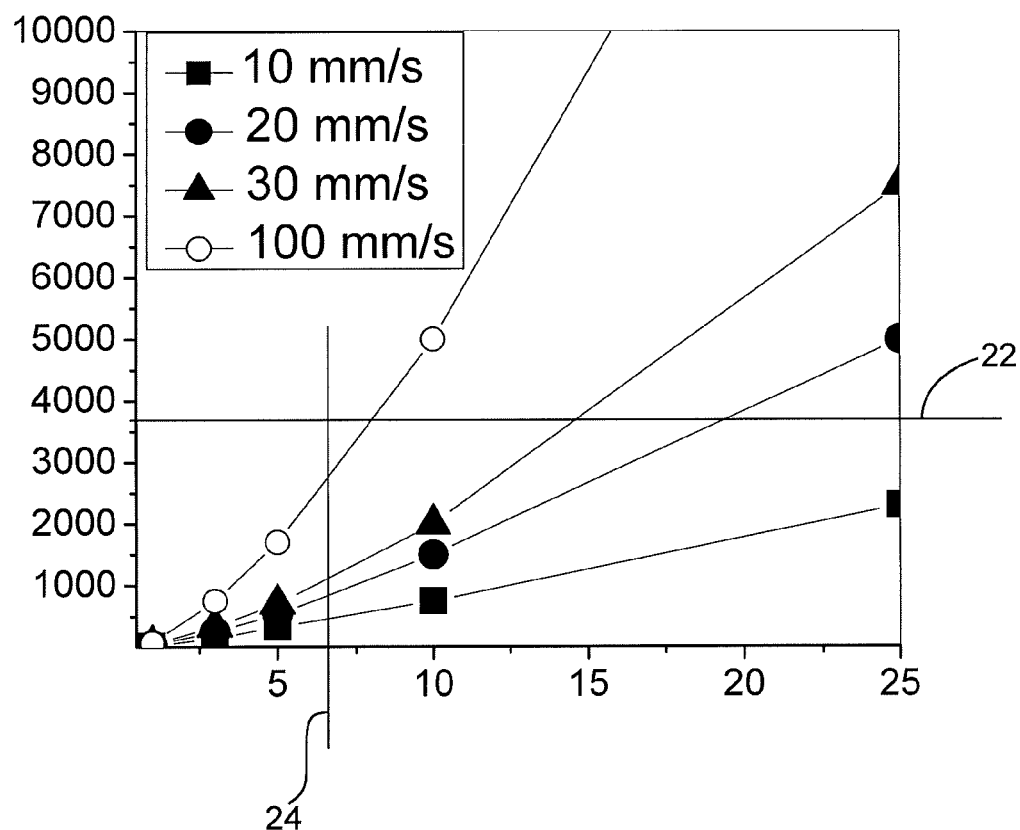
FIG. 5B is a plot showing the relationship between laser power and sintered frit width for four different laser scanning speeds. The vertical axis in this figure is laser power in watts and the horizontal axis is sintered frit width in millimeters.

FIGS. 5A and 5B show the results of experiments and calculations performed with different beam sizes and sintered-frit widths to determine the relationship between laser power and laser scanning speed. In FIG. 5A the horizontal axis is scanning speed in millimeters/second and the vertical axis is laser power in watts required to heat the frit to its melting temperature; in FIG. 5B the horizontal axis is sintered-frit width in millimeters and the vertical axis is again laser power in watts required to heat the frit to its melting temperature. In FIG. 5B, the plotted values for sintered-frit widths greater than 5 millimeters and powers greater than 800 watts are calculated values based on the measurements obtained for the smaller widths and lower powers.

FIG. 5B also includes horizontal line 22 and vertical line 24. Horizontal line 22 represents a practical upper limit on laser power based on the power of lasers that are currently commercially available, i.e., a laser power in the range of 3000-4000 watts. Although available, such high power lasers are expensive and thus in terms of cost effectiveness, lasers having a power that is less than or equal to 1000 watts are preferred. Vertical line 24 shows that when this criterion is applied, the width of the sintered-frit which is being laser sealed is preferably less than about 7 millimeters.

In view of the foregoing, it can be seen that larger sintered-frit widths need higher laser powers and faster scanning speeds. In particular, sealing larger sintered-frit widths require faster scanning speeds to avoid thermal stress in the glass, as well as damage to temperature sensitive element(s) within the package.

In general terms, the local temperature during laser sealing scales linearly with power density and speed to the power 0.5. Experimentally, it has been found that a Gaussian-shaped beam with a diameter at least 1.5 (preferably, at least 1.8) times larger than the sintered-frit width gives a good quality, uniform seal, provided the temperatures achieved at the center and the edge of the sintered-frit are high enough to melt the glass component of the sintered frit. For a 5 mm frit, this results in a 9 mm Gaussian beam. For other beam shapes, the beam width can be similarly determined.

For example, a Gaussian beam can be converted into a flat top beam using beam shaping equipment, e.g., a Newport refractive beam shaper, Catalog Number GBS-NIR-H (Newport Corporation, Irvine, Calif.). For a 9 mm Gaussian beam and a 5 mm sintered frit, the ratio of the temperature at the center of the sintered frit to the temperature at its edge can be estimated as:

$$T_{edge}/T_{center} \sim P_{center}/P_{edge} * (a_{center}/a_{edge})^{0.5}.$$

For the above parameters, $T_{edge}/T_{center}$ for a Gaussian beam is equal to 0.48 and this has been found to give a good quality seal. In the case of a flat top beam, $P_{center}=P_{edge}$. As a result, the beam diameter can be significantly smaller, e.g., $a_{center}/a_{edge}$ can be approximately 1.15. This means that for round flat top beam, the beam diameter only needs to be 1.05 (preferably, 1.15-1.2) times larger than the width of the sintered-frit. This is a significant savings in power for the same power density as a Gaussian beam.

The above relationship can also be derived using the following, somewhat more general, relationship:

$$T_{edge}/T_{center} \sim (P_{center}/P_{edge})(D_{beam}/a)^{0.5}(F(Dg,Df,h)),$$

where, as above, P is power density, $D_{beam}$ is beam diameter, a is length of the segment of the beam diameter at the frit edge, and F(Dg,Df,h) is a diffusion function, where Dg is thermal diffusivity for the glass substrate, Df is thermal diffusivity for the sintered frit, and h is frit width. In the case of a Gaussian beam with a diameter of 9 mm and a sintered frit width of 5 mm, the above relationship gives an estimate for $T_{edge}$ as 0.6-0.7 of $T_{center}$.

In the case of a flat top beam, F(Df,Dg,h) will be about the same as for a Gaussian beam. $D_{beam}/a$ needs to be about 2, meaning that the beam diameter for the flat top beam can be reduced to $D_{beam}/h=1.05$ (preferably, 1.15) instead of $D_{beam}/h=1.5$ (preferably, 1.8) for a Gaussian beam.

As indicated above, for wider sintered-frits, the requirements for a larger beam diameter and the same linear speed of frit exposure mean that higher power densities and faster translation speeds need to be used. A relationship between translation speed (scanning speed) and other parameters of the system can be obtained as follows.

In order to obtain a good seal without generating excessive heat damage, the following relationship is preferably satisfied:

$$K1*T_{frit}(edge) < \tau^{0.5} < K2*T_{glass}(x),$$

where is exposure time, K1 and K2 are scaling which depend on the laser power density and its distribution, $T_{frit}(edge)$ is the temperature of the sintered frit at its edge needed to achieve melting, and $T_{glass}(x)$ is the temperature of the glass substrate at a distance x from the edge of the sintered frit which needs to be low enough so as not to damage the temperature sensitive element(s) being packaged. As expressed in this relationship, the exposure time of the frit by the laser needs to be long enough to melt the frit all the way through its thickness, and short enough so that the glass at a distance x from edge of the sintered frit does not get too hot.

Typical values are $T_{frit}(edge) > 450°$ C., $T_{glass}(x=0.2$ mm$) < 85°$ C. (i.e., a delta T from room temperature equal to 65° C.). The exposure is simply related to the diameter of the beam $\tau = D_{beam}/S$, where $D_{beam}$ is the beam diameter and S is the scanning speed of the laser over the sintered frit. In order for a 15 micron frit to be melted throughout its height, $\tau$ needs to greater than about 15 milliseconds (preferably, 25 milliseconds, which corresponds to a scanning speed of 75 mm/s for a 2 mm beam diameter). To keep the glass cool enough at x>0.2 mm, $\tau$ needs to be smaller than 180 milliseconds. This gives a range at any given beam diameter for the speed requirements. This range is applicable to various systems since the thermal diffusivity of a typical sintered frit and a typical glass substrate will have the same order of magnitude and the frit thickness, e.g., 15-20 microns, can be expected to be smaller than the distance of the heat sensitive element from the edge of the sintered frit (e.g., 200 um).

Using the above relationship, one can determine that to seal a 5 mm frit with a 9 mm beam diameter, the speed needs to be slower than 360 mm/s and faster than 50 mm/s, while for a 3 mm frit with 5.4 mm spot size, the speed range is 216 to 30 mm/s The relationship between the scanning speed S and the parameters of the system can be further quantified by explicitly including in the speed determination the distance between the edge of the sealed portion of the frit and the temperature sensitive element, the degradation temperature of that element, and the melting temperature of the sintered frit. When that is done, the following relationships are obtained:

$$S \geq (11 \text{ mm/sec}) \cdot (D_{beam}/2 \text{ mm}) \cdot (0.2 \text{ mm}/L_{min}) \cdot (65° C./T_{degrade})^2, \text{ and}$$

$$S \leq (130 \text{ mm/sec}) \cdot (D_{beam}/2 \text{ mm}) \cdot (450° C./T_{frit-melt})^2.$$

Preferably, $$S \leq (80 \text{ mm/sec}) \cdot (D_{beam}/2 \text{ mm}) \cdot (450° C./T_{frit-melt})^2.$$

As shown in FIG. 5, higher speeds require higher laser powers in order to reach the same temperature at the sintered frit. The relationship between power density P and scanning speed S at the same spot size can be written:

$$P/(S)^{0.5} = \text{constant}.$$

From this relationship, it can be seen that an increase in speed by factor of 4 requires an increase in P by factor of 2.

Figure 6:
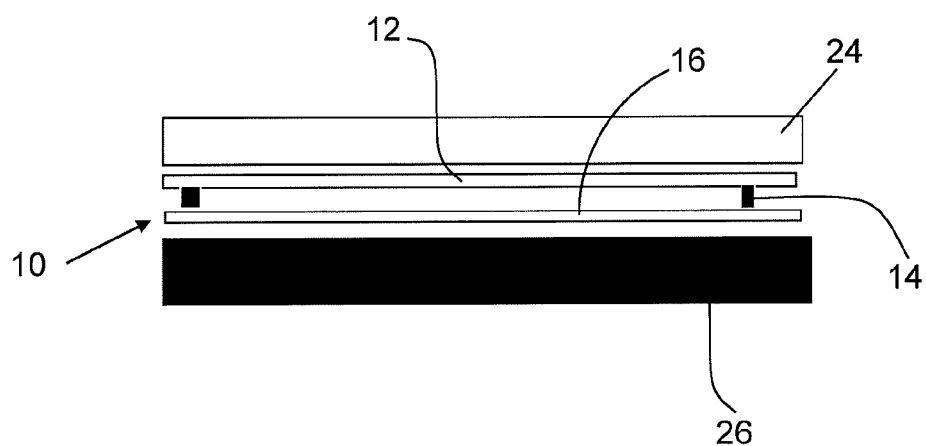
FIG. 6 is a schematic diagram illustrating a thermal management system that can be used in connection with certain embodiments of the present invention.

As can be seen, the above relationships for S take into account the degradation temperature of the one or more elements, e.g., OLEDs, being packaged. To further reduce the chances of thermal damage, it can be beneficial to use thermal sinking for first and second substrates. An example of such thermal sinking is shown in FIG. 6 where, for example, plate 26 can be composed of aluminum and plate 24 can be composed of silica. Similarly, it is preferable to mask the laser beam so that only the portion needed to heat the wall 14 reaches the package.

Turning to FIGS. 7-10, these figures illustrate various constructions for the wall of the package. In these figures, the reference number 28 represents the one or more temperature sensitive elements, e.g., OLEDs being housed in the package.

Figure 7:
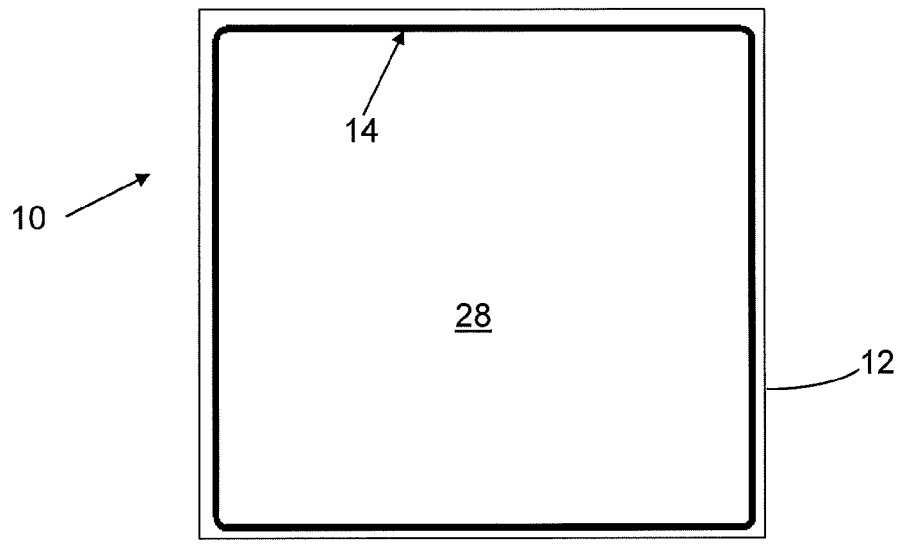
FIG. 7 is a schematic diagram of an embodiment of the invention employing a single sintered frit wall.

FIG. 7 shows the approach in which a single thick wall is used to provide the hermetic seal. FIG. 8 shows an alternate approach wherein the overall width of the wall is still thick but rather than achieving the thickness through the use of a single wall, multiple sub-walls, e.g., two sub-walls as illustrated in FIG. 8, are used.

FIG. 9 shows a further approach in which sub-walls composed of a sintered glass frit are used in combination with a sub-wall composed of an organic material. The organic material is preferably an epoxy resin but other materials, such as a UV curable acrylic resin, can be used in the practice of this aspect of the invention. The sub-wall composed of an organic material is preferably sandwiched between sub-walls composed of a sintered glass frit as shown in FIG. 9, but other arrangements can be used if desired, e.g., the sub-wall composed of an organic material can be the innermost or outermost sub-wall. Also, although the use of a single sub-wall composed of an organic material is shown in FIG. 9, multiple sub-walls of this type can be used if desired. When a sub-wall composed of an organic material is used, the laser beam used to seal the sub-walls composed of the sintered glass frit should be masked so that it does not impinge on the organic material.

FIG. 10 shows a wall which includes multiple sub-walls 30 arranged to form isolated compartments 32. In this way, oxygen and/or moisture can readily pass through one of the compartments only if at least two of the sub-walls of that compartment are breached. Other configurations besides the one shown in FIG. 10 can be used in the practice of this aspect of the invention. For example, the angled sub-walls can intersect the parallel sub-walls at 90°, thus forming a ladder-like or honeycomb-type structure along the length of wall. Also, rather than a single layer of isolated compartments, multiple layers can be used to provide even greater protection against localized failures of the wall.

From the foregoing it can be seen that the preferred embodiments of the various aspects of the invention provide a number of benefits including: longer product lifetimes due to lower rates of moisture and oxygen permeation, higher mechanical strength since strength is related to the width of the sealed frit, and/or combinations of sintered frit and organic seals to provide both a hermetic barrier and high mechanical strength.

A variety of modifications which do not depart from the scope and spirit of the invention will be evident to persons of ordinary skill in the art from the foregoing disclosure. As just one example, although the invention has been described in terms of sealing of packages for use with large OLED-based displays, it can also be used with small displays or with other types of temperature sensitive elements, if desired. The following claims are intended to cover the specific embodiments set forth herein as well as such modifications, variations, and equivalents.

What is claimed is:

1. A package, comprising:
   a first glass substrate,
   a second glass substrate,
   a wall that separates the first and second substrates, said wall comprising a sintered glass frit having a width and a melting temperature Tfrit-melt, and
   at least one element that is sensitive to heat and at least one of oxygen and moisture and is hermetically sealed between the first and second substrates by the wall, said at least one element having a degradation temperature Tdegrade, wherein:
   (i) at least a portion of a width of the wall is laser sealed to the second substrate;
   (ii) a minimum width of the portion of the wall that is sealed to the second substrate at any location along the wall is Wseal-min, where Wseal-min is less than the width of the wall;
   (iii) a minimum distance between an edge of the at least one element and an edge of the portion of the wall that is sealed to the second substrate at any location along the wall is Lmin; and
   (iv) Wseal-min, Lmin, and Tfrit-melt satisfy the relationships:
   (a) Wseal-min≥2 mm;
   (b) 0.2 mm≤Lmin≤2.0 mm; and
   (c) Tfrit-melt≥6.0·Tdegrade.

2. A package comprising a first glass substrate, a second glass substrate, a wall that comprises a sintered glass frit and separates the first and second substrates, and at least one element that is sensitive to at least one of oxygen and moisture and is hermetically sealed between the first and second substrates by the wall, wherein the wall comprises a plurality of isolated compartments, each compartment comprising a plurality of sub-walls which are arranged so that oxygen and moisture can readily pass through the compartment only if at least two of the sub-walls of the same compartment are breached;
   wherein the sub-walls comprise a first sub-wall encircling the at least one element, a second sub-wall encircling the at least one element, the second sub-wall being located within the first sub-wall forming a gap between the first sub-wall and the second sub-wall, and a plurality of third sub-walls extending from the first sub-wall to the second sub-wall dividing the gap into the plurality of isolated compartments.

3. The package of claim 2 wherein the element includes at least one organic light emitting diode.

4. The package of claim 1, wherein one of: (i) Wseal-min≤7 mm; (ii) 03 mm≤Wseal-min≤6 mm; and (iii) Wseal-min approximately equals 5 mm.

5. The package of claim 1, wherein the wall comprises a plurality of nested sub-walls, each of which comprise a sintered glass frit.

6. The package of claim 5, wherein at least one of the nested sub-walls comprises an epoxy resin.

7. The package of claim 1, wherein the wall comprises a plurality of isolated compartments.

8. The package of claim 1, wherein the wall comprises filler particles embedded in the sintered glass frit.

9. The package of claim 1, wherein the at least one temperature sensitive element includes at least one organic light emitting diode (OLED).

10. The package of claim 2, wherein:
    the wall that separates the first and second substrates has a width;
    a minimum width of the portion of the wall that is sealed to the second substrate at any location along the wall is Wseal-min, where Wseal-min is less than the width of the wall; and
    one of: (i) Wseal-min≥2 mm; (ii) Wseal-min≤7 mm; (iii) 3 mm≤Wseal-min≤6 mm; and (iv) Wseal-min approximately equals 5 mm.

11. The package of claim 2, wherein the wall comprises a plurality of nested sub-walls, each of which comprise a sintered glass frit.

12. The package of claim 11, wherein at least one of the nested sub-walls comprises an epoxy resin.

13. The package of claim 2, wherein the wall comprises filler particles embedded in the sintered glass frit.

14. The package of claim 3, wherein the at least one temperature sensitive element is an OLED-based display having a diagonal which is equal to or greater than 14 inches.

15. The package of claim 9, wherein the at least one temperature sensitive element is an OLED-based display having a diagonal which is equal to or greater than 14 inches.

* * * * *